United States Patent  
Incarnati et al.

(10) Patent No.: US 7,324,383 B2
(45) Date of Patent: Jan. 29, 2008

(54) SELECTIVE SLOW PROGRAMMING CONVERGENCE IN A FLASH MEMORY DEVICE

(75) Inventors: Michele Incarnati, Gioia del Marsi (IT); Giovanni Santin, Vazia (IT); Tommaso Vali, Latina (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/414,982

(22) Filed: May 1, 2006

(65) Prior Publication Data
US 2006/0285392 A1 Dec. 21, 2006

(30) Foreign Application Priority Data
Jun. 15, 2005 (IT) .................. RM2005A0310

(51) Int. Cl.
*G11C 16/06* (2006.01)
(52) U.S. Cl. ................ 365/185.22; 365/185.18; 365/185.28; 365/185.19; 365/185.21
(58) Field of Classification Search ........... 365/185.22, 365/185.18, 185.28, 185.19, 185.21
See application file for complete search history.

(56) References Cited

U.S. PATENT DOCUMENTS

| 6,611,460 | B2 | 8/2003 | Lee et al. | |
|---|---|---|---|---|
| 6,643,188 | B2 * | 11/2003 | Tanaka et al. | 365/189.01 |
| 6,803,630 | B2 | 10/2004 | Pio et al. | |
| 6,888,758 | B1 | 5/2005 | Hemink et al. | |
| 7,031,198 | B2 | 4/2006 | Kanai | |
| 7,068,539 | B2 * | 6/2006 | Guterman et al. | 365/185.18 |
| 2004/0066685 | A1 | 4/2004 | Choi | |

* cited by examiner

*Primary Examiner*—David Lam
(74) *Attorney, Agent, or Firm*—Leffert Jay & Polglaze, P.A.

(57) ABSTRACT

A plurality of memory cells are programmed with incrementally increased programming pulses applied to word lines to which the memory cells are coupled. After each pulse, a verify operation determines the threshold voltage for each cell. When the threshold voltage reaches a pre-verify threshold, only the bit line connected to that particular cell is biased with an intermediate voltage that slows down the change in the $V_t$ of the cell. The other cells continue to be programmed at their normal pace. As the $V_t$ for each cell reaches the pre-verify level, it is biased with the intermediate voltage. All of the bit lines are biased with an inhibit voltage as their threshold voltages reach the verify voltage threshold.

24 Claims, 5 Drawing Sheets

SELECTIVE SLOW PROGRAMMING CONVERGENCE IN A FLASH MEMORY DEVICE

RELATED APPLICATION

This application claims priority to Italian Patent Application Ser. No. RM2005A000310, filed Jun. 15, 2005, entitled "SELECTIVE SLOW PROGRAMMING CONVERGENCE IN A FLASH MEMORY DEVICE," which is commonly assigned.

TECHNICAL FIELD OF THE INVENTION

The present invention relates generally to memory devices and in particular the present invention relates to flash memory devices memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed on a random basis by charging the floating gate. The data in a cell is determined by the presence or absence of the charge in the floating gate. The charge can be removed from the floating gate by a block erase operation.

Each memory cell can be programmed as a single bit per cell (i.e., single level cell—SLC) or multiple bits per cell (i.e., multilevel cell—MLC). Each cell's threshold voltage ($V_t$) determines the data that is stored in the cell. For example, in a single bit per cell, a $V_t$ of 0.5V can indicate a programmed cell while a $V_t$ of –0.5V might indicate an erased cell. The multilevel cell may have multiple $V_t$ windows that each indicates a different state. Multilevel cells take advantage of the analog nature of a traditional flash cell by assigning a bit pattern to a specific voltage distribution for the cell. This technology permits the storage of two or more bits per cell, depending on the quantity of voltage ranges assigned to the cell.

It is important that the $V_t$ distributions be sufficiently spaced apart so as to reduce the possibility of a higher voltage of one distribution overlapping a lower $V_t$ of the next distribution. The overlap can occur due to noise or temperature variations of the integrated circuit. One way to create larger gaps between the various threshold voltage distributions is to make the distributions themselves narrower. This can be a problem since memory cells program at different rates.

Faster memory cells may be programmed before the slower cells since the faster cells require fewer programming pulses. This can result in the $V_t$ distribution for the faster cells being different and/or closer to other distributions than slower cells due to the wider distributions created by faster cells.

One way to solve this problem is illustrated in U.S. Pat. No. 6,643,188 to Tanaka et al. and assigned to Toshiba and SanDisk Corporation. Tanaka et al. disclose a two-step programming method that uses first and second step verify voltages. Once a threshold voltage for a memory cell being programmed reaches the first step verify voltage, a write control voltage is changed for all cells being programmed. This slows down the programming of all the memory cells.

One problem with this approach is that it reduces programming throughput. Reducing the programming speed of all of the cells being programmed increases the time it takes to program all of the cells, whether they are a fast cell or a slow cell.

Another method that may be used to create narrower distributions is to adjust the programming pulse step voltage as the cell approaches a programmed state. However, this also slows the programming for all of the bits, thus reducing programming throughput. This is especially true for the higher distributions that require additional programming pulses that take longer to reach due to the smaller increment.

For the reasons stated above, and for other reasons stated below which will become apparent to those skilled in the art upon reading and understanding the present specification, there is a need in the art for a way to generate narrow $V_t$ distributions without reducing the programming throughput of the memory device.

SUMMARY

The above-mentioned problems with a non-volatile memory device and other problems are addressed by the present invention and will be understood by reading and studying the following specification.

The present invention encompasses a method for selectively slow programming convergence in a memory device. The memory device comprises an array of memory cells having rows coupled by word lines and columns coupled by bit lines. Each memory cell has a threshold voltage indicating a programmed/erased state. The method comprises increasing the threshold voltage for each of a plurality of memory cells that are desired to be programmed; each to a predetermined state.

Each bit line that is coupled to a memory cell of the plurality of memory cells is selectively biased with a first bit line voltage only when the threshold voltage of the associated memory cell reaches a pre-verify threshold voltage. The pre-verify threshold voltage is less than a verify threshold voltage. The first bit line voltage is greater than 0V and less than $V_{CC}$. In one embodiment, this voltage could be in the range of 0.5V to 0.9V.

Further embodiments of the invention include methods and apparatus of varying scope.

DETAILED DESCRIPTION

Figure 1:
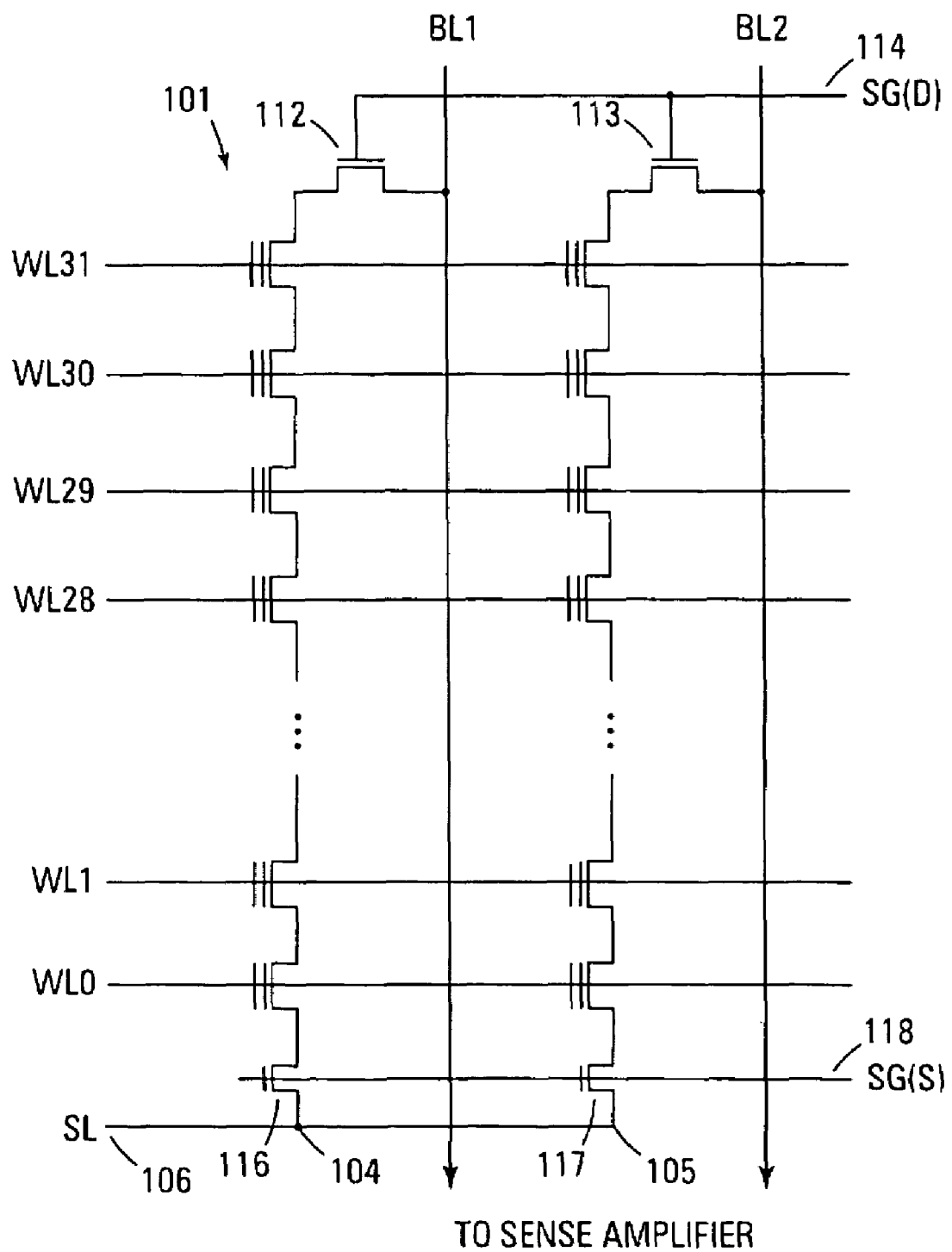
FIG. 1 shows a simplified schematic diagram of one embodiment of a flash memory array of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified diagram of one embodiment for a main NAND flash memory array of the present invention. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 101 arranged in series columns 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

During a typical prior art programming operation, the selected word line for the flash memory cell to be programmed is biased with a series of incrementing voltage programming pulses that start at an initial voltage that is greater than a predetermined programming voltage (e.g., approximately 16V). After each programming pulse, a verification operation with a word line voltage of 0V is performed to determine if the cell's threshold voltage $V_t$ has increased to the properly programmed level (e.g., 0.5V).

The unselected word lines for the remaining cells are typically biased at a voltage that is less than the programming voltage (e.g., approximately 10V) during the program operation. In one embodiment, the unselected word line voltages can be any voltage above ground potential. Each of the memory cells is programmed in a substantially similar fashion.

A memory array of the present invention is broken down into memory blocks. The quantity of memory blocks is typically determined by the size of the memory device (i.e., 512 MB, 1 GB). Each memory block is comprised of 64 pages.

The array illustrated in FIG. 1 is for a NAND architecture array. The embodiments of the present invention, however, are not limited to any one type of array architecture. For example, the present invention may also operate properly in NOR or AND architecture arrays.

Figure 2:
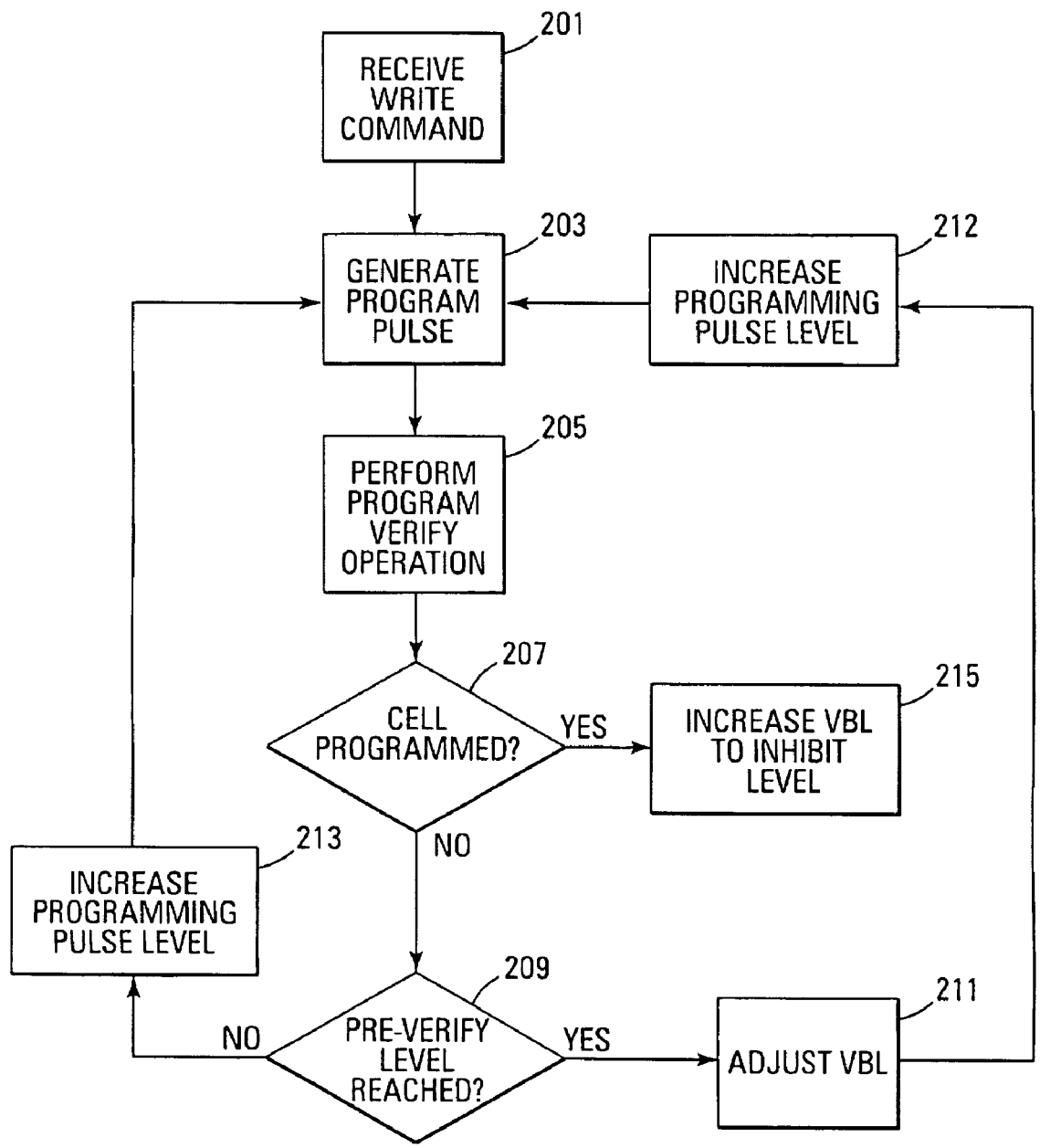
FIG. 2 shows a flowchart of one embodiment of a selective slow programming method of the present invention.

FIG. 2 illustrates a flowchart of one embodiment for a selective slow programming convergence method of the present invention. A command is received to write data 201 to one or more memory cells. The data may be a single bit or multiple bits.

As described previously, a programming pulse is generated 203 and applied to the selected word line. A program verify operation is then performed 205 to determine if the cell has been properly programmed 207. The verify operation is simply a read of the cell to determine its contents and a comparison of the read data with the desired data.

If the cell has been programmed, its drain connection (i.e., the bit line to which it is connected) is biased at a program inhibit voltage 215. In one embodiment, $V_{BL}$ is increased from the 0V bit line biasing used during programming to $V_{CC}$. Alternate embodiments may use other inhibit voltages for $V_{BL}$.

If the verify operation determines that the cell is not yet programmed with the desired data 207, the threshold voltage for the cell is checked to determine if it has reached a pre-verify voltage level 209 for that particular state. Each state has a pre-verify voltage level at which, when the threshold voltage for that particular state reaches that level, the programming of that particular cell is slowed down by biasing the bit line 211 coupled to the cell.

Unlike the prior art, the method of the present invention selectively slows the programming of each cell that has passed the pre-verify threshold for the particular state being programmed into the cell. Other cells being programmed are unaffected by the bit line biasing and are allowed to be programmed at their normal programming speed. This has the effect of narrowing the $V_t$ distribution without reducing the programming throughput.

Figure 3:
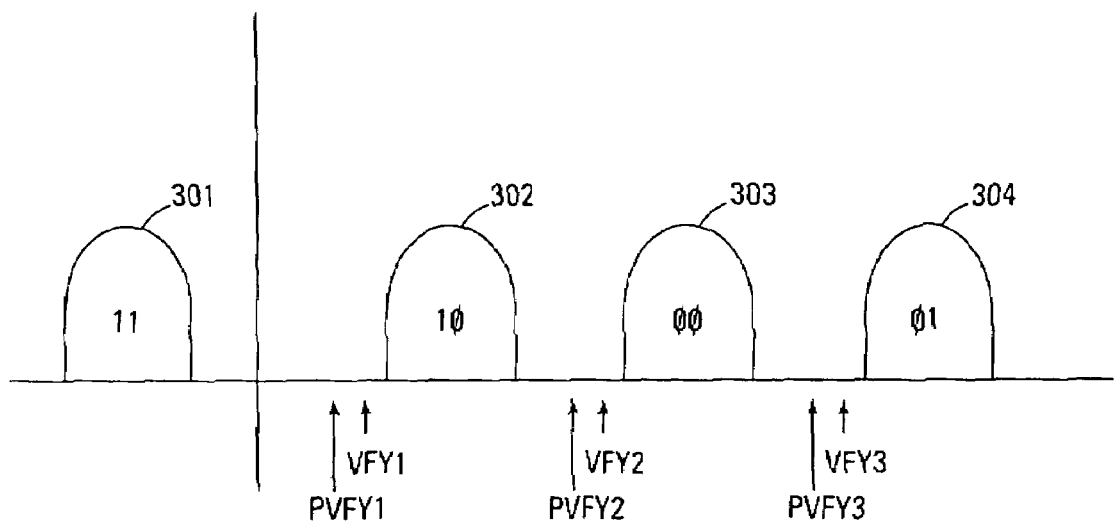
FIG. 3 shows a diagram of one embodiment of $V_t$ distributions of the present invention.

The pre-verify voltage level, as illustrated in FIG. 3 and discussed subsequently, is less than the verify voltage level. For example, a first programmed state (i.e., "10") might have a pre-verify voltage of 0.3V and a verify voltage level of 0.5V. Alternate embodiments can use other voltages and different voltage differences between the pre-verify and verify voltages.

The biasing of the bit line reduces the voltage drop across the memory cell transistor, thus reducing the effective programming voltage applied to the cell. The lower the programming voltage, the slower the movement of the $V_t$ for that cell. In one embodiment, the bit line bias voltage ($V_{BL}$) is in a range of 0.5 to 0.9. However, the present invention is not limited to any one voltage or range of voltages.

After the bit line voltage VBL has been increased 211, the programming process repeats by generating another programming pulse 203 that is incrementally larger than the previous pulse 212. In one embodiment, the programming pulses are increased by a 200 mV step voltage. This step voltage is for purposes of illustration only as the present invention can use any step voltage to increase the programming pulse levels.

However, since the voltage drop across the memory cell transistor is now reduced due to the $V_{BL}$ increase, the increased programming pulse voltage will have a reduced effect on programming the cell. The programming operation of that particular state in the cell continues until the cell is programmed and the $V_{BL}$ is increased to the inhibit voltage.

If the pre-verify voltage level has not been reached 207, the programming pulse voltage is increased 213 by the step voltage and the incrementally increase programming pulse is applied to the cell's word line 203. The programming process repeats until the pre-verify voltage level is reached 209, the bit line voltage is adjusted 211 to slow the programming, and the cell is eventually programmed 207 such that the bit line voltage is increased to the inhibit voltage 215.

The method of FIG. 2 is performed on each bit in a selective manner. Instead of biasing the bit line of all cells when a bit has reached a pre-verify voltage, only as each cell reaches the pre-verify threshold is its particular bit line voltage increased to slow the programming speed.

In a memory device using multi-level cells, the bits may be located in the same page address or in multiple page addresses. When the bits are in the same page address, both bits can be changed at the same time. In other words, a same page address programming process can go directly from the erased state of "11" to a programmed state of "00". If one or more of the multiple bits are in different page addresses, only one bit at a time is changed. For example, to go from the erased state of "11" to the programmed state of "00", it is typically necessary to go through either state "10" or state "01", depending upon where these states are mapped. The selective slow programming convergence method of the present invention works in either of these embodiments.

FIG. 3 illustrates a diagram of one embodiment of $V_t$ distributions 301-304 of the present invention. The diagram shows that the erased state "11" 301 is at a negative $V_t$. States "10" 302, "00" 303, and "01" 304 have respectively increasing $V_t$ distributions.

Each "non-erased" distribution 302-303 has an associated pre-verify voltage (PVFY1-PVFY3) as discussed previously. Each "non-erased" state 302-304 also has a verify voltage (VFY1-VFY3) that is larger than the pre-verify voltage.

The diagram of FIG. 3 is for purposes of illustration only as the selective slow programming convergence method of the present invention is not limited to just the quantity of illustrated states or the particular mapped $V_t$ location of each state. The present invention is not related to the particular binary coding of a distribution but generally to the transition from a generic distribution to a different distribution having a higher $V_t$.

For example, in an alternate embodiment, the multi-level cells can have more than two bits thus necessitating additional distributions. In yet another embodiment, each state may be mapped to a different location. For example, state "10" may be mapped to the higher $V_t$ distribution and state "01" mapped to the lower $V_t$ distribution. The embodiments of the present invention can operate properly in any such instances.

Figure 4:
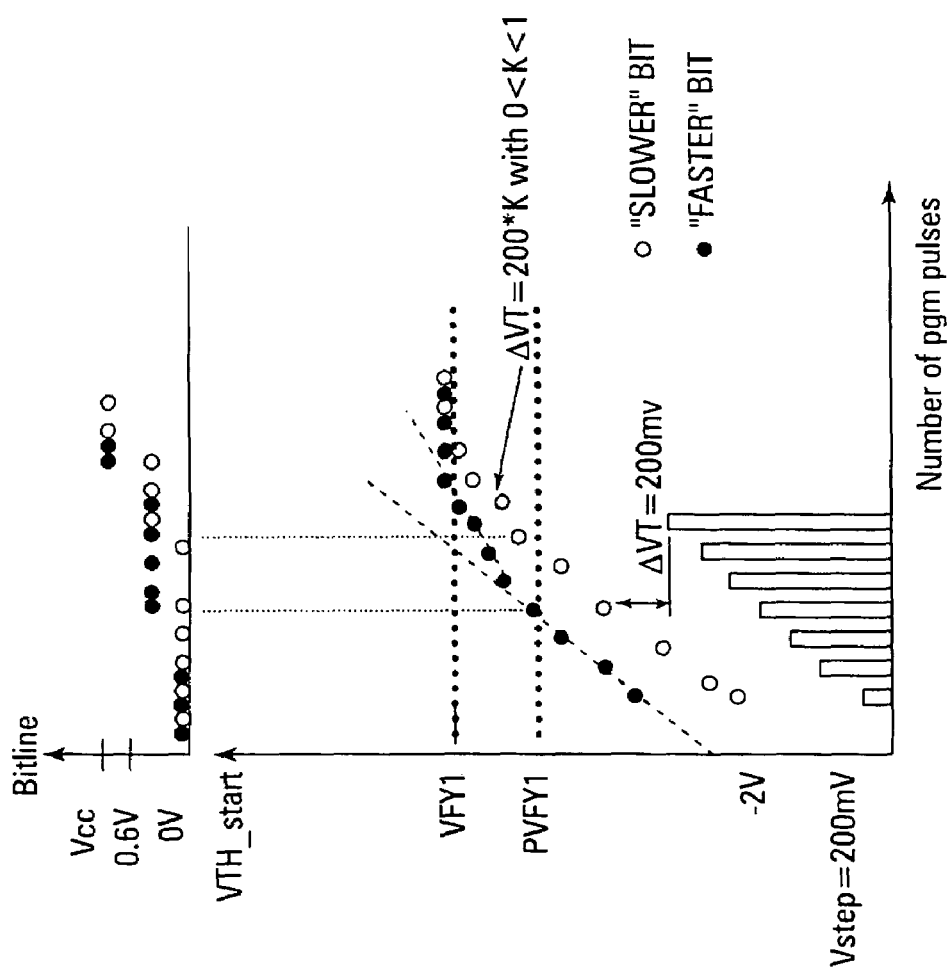
FIG. 4 shows a plot of one embodiment of programming pulses, data bit voltage levels, and bit line voltage levels in accordance with the embodiment of FIG. 2.

FIG. 4 illustrates a plot of one embodiment of programming pulses with resulting data bit voltage levels and bit line voltage levels in accordance with the selective slow programming convergence method of FIG. 2. The lower plot shows the programming pulses with the voltage level of each pulse increasing by $V_{step}$ along the bottom axis. The illustrated embodiment uses a $V_{step}$ of 200 mV. However, the present invention is not limited to any one step voltage.

The circles represent two bits that program at different rates. The solid circle programs at a faster rate than the hollow circle. The upward movement of the circles represents an increasing $V_t$. Prior to the PVFY1 threshold, the slower bit is increasing at a $\Delta V_t$ of 200 mV. The solid circle (i.e., faster bit) reaches the pre-verify voltage first. In the illustrated embodiment, this is shown as PVFY1 as discussed in FIG. 3. However, this could also be any of the other pre-verify levels such as PVFY2-3.

When the faster bit reaches the pre-verify voltage threshold, the upper graph shows that a voltage of approximately 0.6V is applied to the bit line. The bit line of the slower bit is still at 0V.

The middle graph shows that the "faster" bit is now increasing at a slower rate that can be represented by $\Delta V_t = 200 * K$ where $0 < K < 1$ when the step voltage is equal to 200 mV. Alternate step voltages would have a different $\Delta V_t$.

Once both the slower bit and the faster bit reach the verify voltage threshold VFY1, the upper graph shows that an inhibit voltage of $V_{CC}$ is applied to the bit line. The middle graph then shows that the increase of the Vt of each bit has stopped due to the end of the programming operation.

Figure 5:
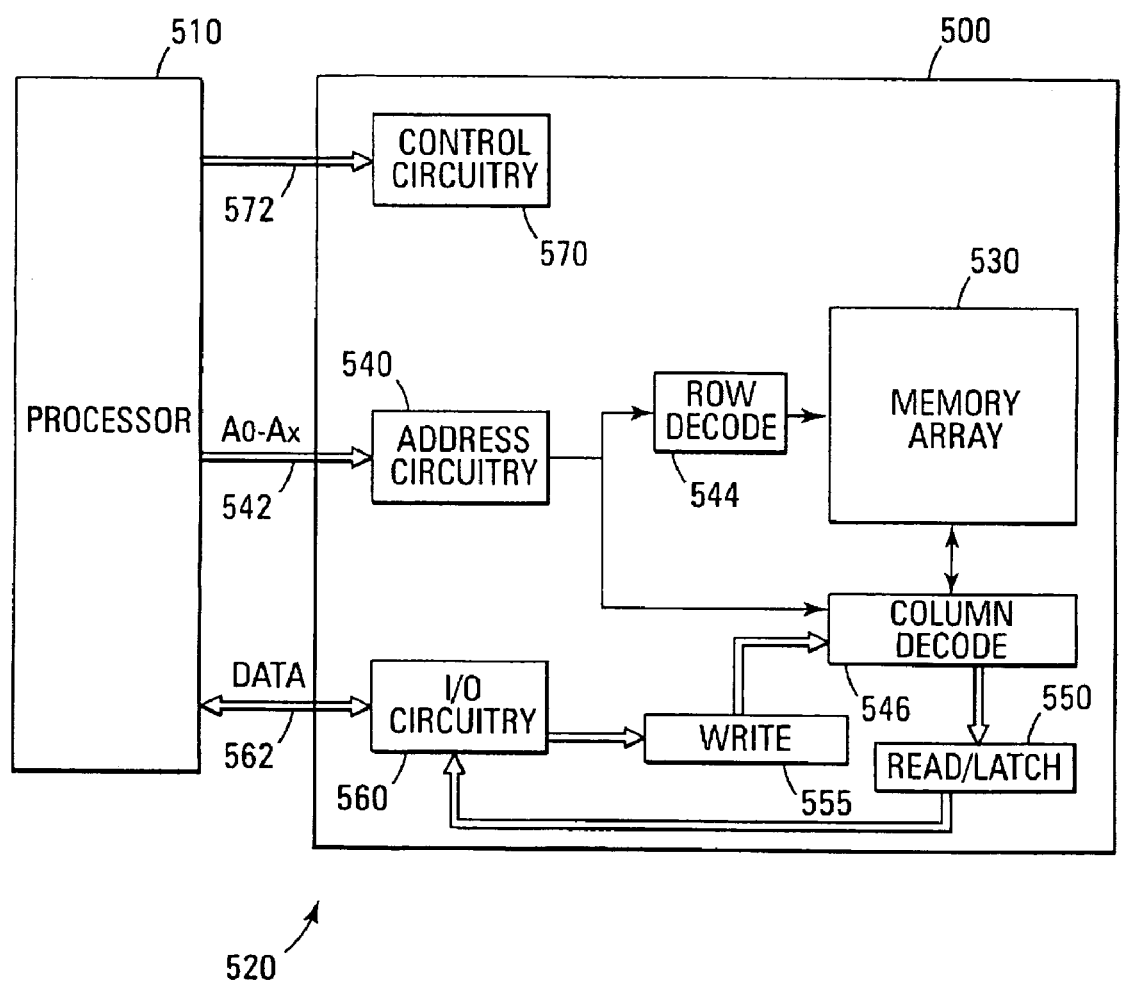
FIG. 5 shows a simplified block diagram of one embodiment of a memory system of the present invention.

FIG. 5 illustrates a functional block diagram of a memory device 500 of one embodiment of the present invention that is coupled to a processor 510. The processor 510 may be a microprocessor, a processor, or some other type of controlling circuitry. The memory device 500 and the processor 510 form part of an electronic system 520. The memory device 500 has been simplified to focus on features of the memory that are helpful in understanding the present invention.

The memory device includes an array of memory cells 530. In one embodiment, the memory cells are non-volatile floating-gate memory cells and the memory array 530 is arranged in banks of rows and columns.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/latch circuitry 550. The sense/latch circuitry, in one embodiment, is coupled to read and latch a row of data from the memory array 530. Data input and output buffer circuitry 560 is included for bi-directional data communication over a plurality of data connections 562 with the controller 510). Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 executes the embodiments of the selective slow programming convergence method of the present invention. The control circuitry 570 may be a state machine, a sequencer, or some other type of controller.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the embodiments of the present invention provide an improved method for reducing the width of the $V_t$ distributions without reducing the programming throughput. This is accomplished by selectively biasing the bit lines of each cell being programmed as the $V_t$ of each cell reaches a pre-verify voltage level that is less than the verify voltage level used by a program verify operation.

The embodiments of the present invention are not limited to any one type of memory technology. For example, the circuits and methods of the present invention may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for selectively slow programming convergence in a memory device comprising an array of memory cells having rows coupled by word lines and columns coupled by bit lines, the method comprising:
   increasing a threshold voltage for each of a plurality of memory cells; and
   selectively biasing bit lines coupled to the plurality of memory cells such that only a first bit line is biased with a voltage greater than 0V when the threshold voltage of a memory cell that is coupled to the first bit line reaches a first verify threshold voltage of two verify threshold voltages, the first verify threshold voltage being less than the second verify threshold voltage.

2. The method of claim 1 wherein increasing the threshold voltage comprises generating a plurality of programming pulses on a predetermined word line coupled to the memory cell being programmed.

3. The method of claim 1 and further including biasing remaining bit lines at ground potential such that memory cells having a threshold voltage below the first verify threshold voltage are programmed at a faster rate than the memory cell coupled to the first bit line.

4. The method of claim 1 and further including performing a verify operation to determine the threshold voltage for each memory cell being programmed.

5. The method of claim 1 wherein the memory device comprises a flash memory device.

6. The method of claim 5 wherein the flash memory device is one of a NAND-type flash memory or a NOR-type flash memory.

7. The method of claim 1 wherein the second verify threshold voltage is a threshold voltage at which the memory cell is considered to be programmed.

8. The method of claim 1 wherein the threshold voltage is part of a threshold voltage distribution indicating one of a plurality of possible multilevel states programmable into the memory cell.

9. A method for selectively slow programming convergence in a flash memory device comprising a matrix of memory cells having rows coupled by word lines and columns coupled by bit lines, the method comprising:
   performing a programming operation on each of a plurality of memory cells;
   performing a verify operation on each of the plurality of memory cells to determine its respective threshold voltage; and
   selectively biasing bit lines coupled to the plurality of memory cells such that a bit line is only biased with a first bit line bias voltage when the threshold voltage of a first memory cell coupled to the bit line reaches a first verify threshold voltage of two verify threshold voltages, the first verify threshold voltage being less then the second verify threshold voltage, the first bit line bias voltage being greater than 0V and less than a supply voltage.

10. The method of claim 9 wherein performing the programming operation comprises generating a plurality of programming voltage pulses that increase incrementally by a step voltage.

11. The method of claim 9 and further including selectively biasing only the bit line, coupled to the first memory cell, with an inhibit voltage in response to the first memory cell having a threshold voltage at least equal to the second verify threshold voltage.

12. The method of claim 11 wherein the inhibit voltage is the supply voltage.

13. A memory device comprising:
   an array of memory cells arranged in rows and columns such that the rows are coupled by word lines and the columns are coupled by bit lines, each memory cell having an associated threshold voltage; and
   control circuitry that controls programming of the array of memory cells, the control circuitry adapted to control generation of a plurality of programming pulses to increase the associated threshold voltages of a set of memory cells to be programmed, the control circuitry further adapted to selectively control bit line biasing such that only a bit line that is coupled to a memory cell having a threshold voltage that is equal to or greater than a first verify threshold voltage but less than a second verify threshold voltage experiences an increase in biasing from ground potential.

14. The device of claim 13 wherein the array of memory cells is comprised of floating gate field effect transistors.

15. The device of claim 13 wherein a threshold voltage that is equal to or greater than the second verify threshold voltage is indicative of a programmed memory cell.

16. The device of claim 13 wherein the control circuitry is further adapted to control generation of additional programming pulses, increasing by a predetermined step voltage from a previous programming pulse, in response to threshold voltages that are less than the second verify threshold voltage.

17. The device of claim 13 wherein the memory device is a NAND flash memory device.

18. The device of claim 13 wherein the control circuitry is further adapted to bias, at 0V, all bit lines associated with memory cells having threshold voltages that have not yet reached the first verify threshold voltage.

19. A memory system comprising:
   a processor that generates memory program signals; and
   a memory device coupled to the processor that operates in response to the memory program signals, the memory device comprising:
   an array of memory cells arranged in rows and columns such that the rows are coupled by word lines and the columns are coupled by bit lines, each memory cell having an associated threshold voltage; and control circuitry that controls programming of the array of memory cells, the control circuitry adapted to control generation of a plurality of programming pulses to increase the associated threshold voltages of a set of memory cells to be programmed, the control circuitry further adapted to selectively control biasing of the bit lines such that only a bit line coupled to a memory cell having a threshold voltage that is equal to or greater than a first verify threshold voltage but less than a second verify threshold voltage experiences an increase in bit line bias voltage from 0V.

20. A method for selectively slow programming convergence in a flash memory device comprising a matrix of memory cells having rows coupled by word lines and columns coupled by bit lines, the method comprising:

performing a programming operation on each of a set of multilevel memory cells, each memory cell of the set having a threshold voltage distribution, the programming operation comprising a plurality of programming pulses that increase incrementally from a previous pulse and are applied to each word line coupled the set of memory cells, the threshold voltage distribution increasing in response to each programming pulse;

performing a verify operation, after each programming pulse, on each memory cell to determine its respective threshold voltage distribution;

selectively biasing, with a first bias voltage, only each bit line that is coupled to a memory cell having maximum voltage in its threshold voltage distribution that is equal to or greater than a pre-verify threshold voltage and less than a verify threshold voltage, the first bias voltage being greater than 0V and less than a supply voltage; and selectively biasing, with an inhibit voltage, only each bit line that is coupled to a memory cell having the maximum voltage in the threshold voltage that is at least equal to the verify threshold voltage.

21. The method of claim 20 wherein the first bias voltage comprises a voltage in a range of 0.5 to 0.9V.

22. The method of claim 20 wherein the inhibit voltage is substantially equal to $V_{CC}$.

23. The method of claim 20 wherein the threshold voltage distribution indicates one of a plurality of states programmed into the memory cell.

24. The method of claim 23 wherein the plurality of states comprise two bits of data.

* * * * *